United States Patent
Koike et al.

(10) Patent No.: US 12,444,686 B2
(45) Date of Patent: Oct. 14, 2025

(54) SEMICONDUCTOR DEVICE

(71) Applicant: Tohoku University, Miyagi (JP)

(72) Inventors: Junichi Koike, Miyagi (JP); Masataka Yahagi, Miyagi (JP); Yuki Yamada, Miyagi (JP)

(73) Assignee: TOHOKU UNIVERSITY, Sendai (JP)

( * ) Notice: Subject to any disclaimer, the term of this patent is extended or adjusted under 35 U.S.C. 154(b) by 441 days.

(21) Appl. No.: 17/928,428

(22) PCT Filed: Jun. 4, 2020

(86) PCT No.: PCT/JP2020/022202
§ 371 (c)(1),
(2) Date: Nov. 29, 2022

(87) PCT Pub. No.: WO2021/245893
PCT Pub. Date: Dec. 9, 2021

(65) Prior Publication Data
US 2023/0154851 A1 May 18, 2023

(51) Int. Cl.
*H01L 23/532* (2006.01)
*H01L 21/768* (2006.01)

(52) U.S. Cl.
CPC .. *H01L 23/53238* (2013.01); *H01L 21/76802* (2013.01); *H01L 21/76843* (2013.01); *H01L 21/76877* (2013.01)

(58) Field of Classification Search
CPC ......... H01L 23/53238; H01L 21/76802; H01L 21/76843; H01L 21/76877; H01L 21/2855;
(Continued)

(56) References Cited

U.S. PATENT DOCUMENTS

| 6,538,324 B1 | 3/2003 | Tagami et al. |
| 2003/0132123 A1* | 7/2003 | Turner .................... C22B 34/14 |
| | | 423/155 |

(Continued)

FOREIGN PATENT DOCUMENTS

| JP | 11145141 A | 5/1999 |
| JP | 20017204 A | 1/2001 |

(Continued)

OTHER PUBLICATIONS

International Search Report for PCT/JP2020/022202 dated Aug. 13, 2020, 4 pages.
(Continued)

*Primary Examiner* — Karen Kusumakar
(74) *Attorney, Agent, or Firm* — Faegre Drinker Biddle & Reath LLP

(57) ABSTRACT

Provided is a semiconductor device, which has a wiring structure including a single-layer diffusion barrier layer having both a diffusion barrier function and a liner function. The semiconductor device has a wiring structure including an insulating layer, a conductive wiring, and a diffusion barrier layer disposed between the insulating layer and the conductive wiring in a manner of being in contact with both the insulating layer and the conductive wiring. The diffusion barrier layer is made of an alloy having an amorphous structure containing a first metal and a second element in an amount of 90% by mass or more in total. The first metal is any one selected from Co, Ru, and Mo. The second element is one or two or more selected from Zr, Al, and Nb when the first metal is Co, the second element is Zr when the first metal is Ru, and the second element is one or two selected from Y and B when the first metal is Mo.

8 Claims, 2 Drawing Sheets

(58) Field of Classification Search
CPC ......... H01L 23/53209; H01L 23/53266; H01L 23/5283
See application file for complete search history.

(56) References Cited

U.S. PATENT DOCUMENTS

| | | |
|---|---|---|
| 2005/0006222 A1 | 1/2005 | Ding et al. |
| 2006/0113685 A1 | 6/2006 | Ueki et al. |
| 2008/0012134 A1 | 1/2008 | Choi et al. |
| 2010/0032837 A1 | 2/2010 | Nakagawa et al. |
| 2018/0096888 A1 | 4/2018 | Naik et al. |
| 2019/0164896 A1 | 5/2019 | Koike et al. |
| 2020/0118924 A1* | 4/2020 | Yang .................. H01L 23/5283 |
| 2021/0242082 A1* | 8/2021 | Maniscalco ....... H01L 21/76844 |

FOREIGN PATENT DOCUMENTS

| | | |
|---|---|---|
| JP | 2005510045 A | 4/2005 |
| JP | 200853753 A | 3/2008 |
| JP | 200898424 A | 4/2008 |
| JP | 2012169480 A | 9/2012 |
| JP | 2019531604 A | 10/2019 |
| KR | 100761467 B1 | 9/2007 |
| WO | 2018063815 A1 | 4/2018 |

OTHER PUBLICATIONS

Translation of the International Preliminary Report on Patentabiity for corresponding PCT/JP2020/022202 dated Dec. 15, 2022, 5 pages.

* cited by examiner

[FIG. 1A]
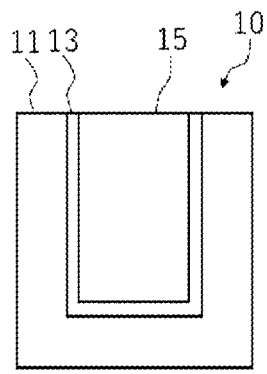
[FIG. 1B]
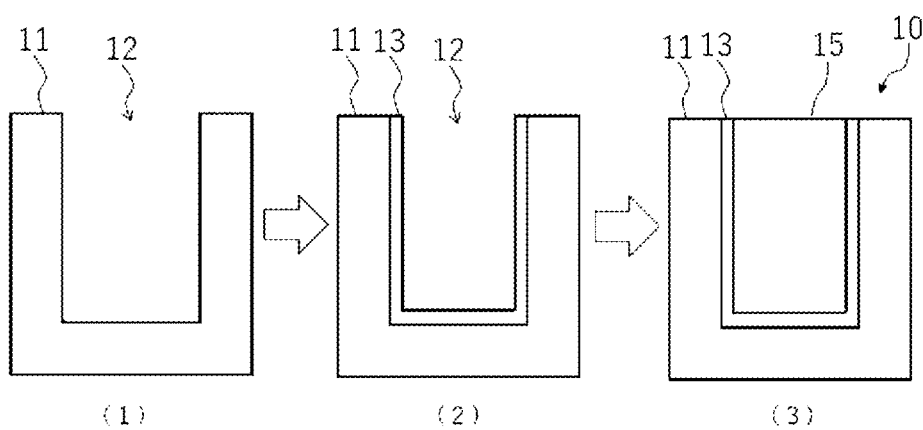
[FIG. 2] PRIOR ART
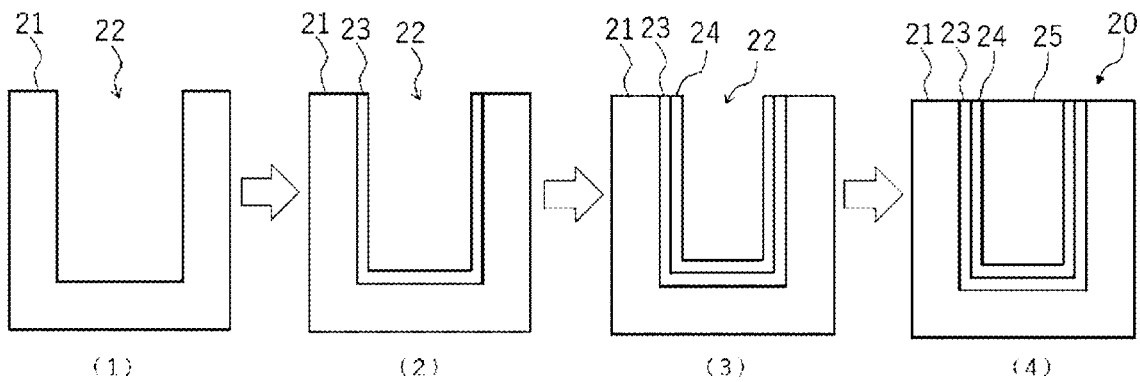

[FIG. 3]
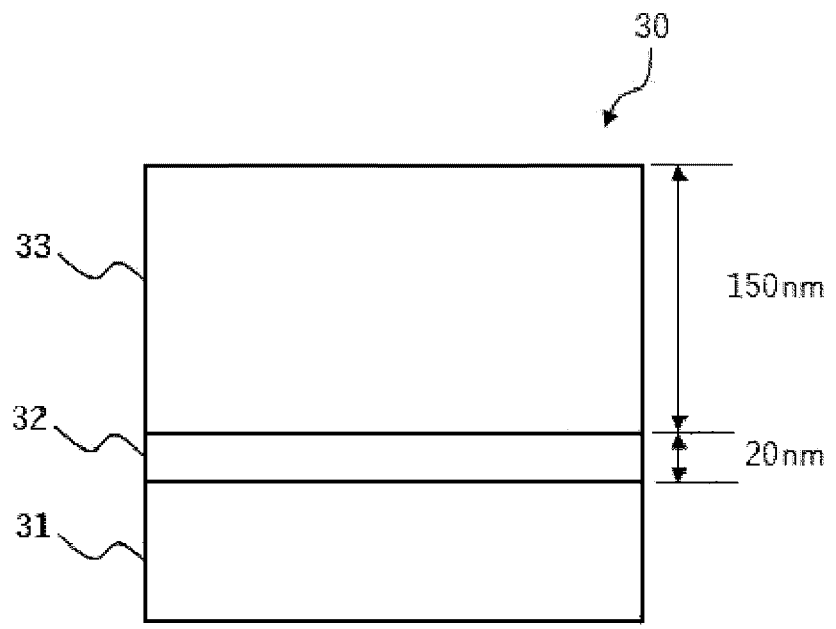

SEMICONDUCTOR DEVICE

TECHNICAL FIELD

The present invention relates to a semiconductor device having a wiring structure.

BACKGROUND ART

With miniaturization of an LSI, a line width of a multilayer wiring connected to a transistor is narrowed. For example, a line width of a local wiring is reduced to 40 nm, 18 nm, and 10 nm by miniaturizing a technology node of the LSI to 22 nm, 10 nm, and 5 nm. In the multilayer wiring, copper wirings are arranged vertically and horizontally in an insulating layer based on, for example, $SiO_2$. Since copper and $SiO_2$ mutually diffuse and cause a current leak between the wirings, a diffusion barrier layer is required at an interface between copper and $SiO_2$. Currently, as the diffusion barrier layer, amorphous TAN or the like is often used. Recently, an example is also known in which a Co—Ti alloy, a Co—Hf alloy, and a Co—Ta alloy are used as the diffusion barrier layer (PTL 1). However, the diffusion barrier layer is generally insufficient in wettability and adhesion to copper. Therefore, in order to improve the wettability and adhesion to copper, it is proposed to laminate a liner layer made of Ta, Co, or the like between the diffusion barrier layer and copper (PTL 2 and PTL 3).

FIG. 2 is a schematic cross-sectional view showing a process for forming a wiring structure 20 in a semiconductor device in the related art. (1) A wiring trench 22 is formed in an insulating layer 21. (2) A diffusion barrier layer 23 made of TaN or the like is formed on an inner surface of the wiring trench 22. (3) A liner layer 24 made of Ta, Co, or the like is formed on the diffusion barrier layer 23. (4) A copper wiring 25 is embedded on the liner layer 24. The embedding of the copper wiring 25 includes, for example, a step of forming a copper seed layer on the liner layer and a subsequent step of plating an electrolytic copper.

CITATION LIST

Patent Literature

PTL 1: US2019/0164896
PTL 2: JP2005-510045A
PTL 3: JP2019-531604A

SUMMARY OF INVENTION

Technical Problem

However, in the wiring structure 20 in the semiconductor device in the related art, since the diffusion barrier layer 23 and the liner layer 24 are individually formed as two layers in the wiring trench 22 formed in the insulating layer 21, an occupied portion of the copper wiring 25 is narrow, that is, a volume ratio of the copper wiring 25 with which the wiring trench 22 is filled is small. In particular, in an advanced technology node of 10 nm or less, even when the volume ratio is slightly reduced, a degree of increase in wiring resistance in association with miniaturization reaches a level that cannot be ignored. Therefore, in order to cope with the miniaturization of the technology node of the LSI, it is desirable to provide a wiring structure capable of increasing the volume ratio of the copper wiring with which the wiring trench 22 is filled.

The invention has been made in view of the above circumstances. An object of the invention is, according to an embodiment, to provide a semiconductor device having a wiring structure including a diffusion barrier layer, which has both a diffusion barrier function and a liner function, instead of forming two individual layers which are a diffusion barrier layer and a liner layer.

Solution to Problem

As a result of intensive studies to solve the above problem, the present inventors have found that a diffusion barrier layer having both a diffusion barrier function and a liner function can be obtained by combining specific elements. The invention, which is completed based on the above findings, is exemplified below.

(1)
A semiconductor device, which has a wiring structure including an insulating layer, a conductive wiring, and a diffusion barrier layer disposed between the insulating layer and the conductive wiring in a manner of being in contact with both the insulating layer and the conductive wiring, in which
   the insulating layer contains a silicon oxide and/or a silicon oxide containing at least one element of C, N, and H,
   the conductive wiring contains Cu and/or Co,
   the diffusion barrier layer is made of an alloy having an amorphous structure containing a first metal and a second element in an amount of 90% by mass or more in total,
   the first metal is any one selected from Co, Ru, and Mo,
   when the first metal is Co, the second element is one or two or more selected from Zr, Al, and Nb,
   when the first metal is Ru, the second element is Zr, and
   when the first metal is Mo, the second element is one or two selected from Y and B.

(2)
The semiconductor device according to (1), in which the diffusion barrier layer has a thickness of 5 nm or less.

(3)
The semiconductor device according to (1) or (2), in which the first metal is Co, and the second element is one or two or more selected from Zr, Al, and Nb.

(4)
The semiconductor device according to (1) or (2), in which the first metal is Ru and the second element is Zr.

(5)
The semiconductor device according to any one of (1) and (2), in which the first metal is Mo, and the second element is one or two selected from Y and B.

Advantageous Effects of Invention

A semiconductor device according to an embodiment of the invention has a wiring structure including a diffusion barrier layer, which has both a diffusion barrier function and a liner function. In the wiring structure, since it is unnecessary to form two individual layers which are diffusion barrier layer and a liner layer and it is sufficient to form a single-layer diffusion barrier layer, it is possible to increase a volume ratio of an occupied portion of a conductive wiring that is made of copper or the like and with which a wiring trench is filled, and it is possible to attain a special effect that, for example, a degree of increase in wiring resistance in association with miniaturization of an LSI can be mitigated.

BRIEF DESCRIPTION OF DRAWINGS

FIG. 1A is a schematic cross-sectional view showing a wiring structure in a semiconductor device according to an embodiment of the invention.

FIG. 1B is a schematic cross-sectional view showing a process for forming a wiring structure in a semiconductor device according to an embodiment of the invention.

FIG. 2 is a schematic cross-sectional view showing a process for forming a wiring structure in a semiconductor device in the related art.

FIG. 3 is a schematic cross-sectional view showing a laminated structure of a laminated body prepared in an example.

DESCRIPTION OF EMBODIMENTS

Hereinafter, embodiments of the invention will be described with reference to the drawings. The invention is not to be construed as being limited to these embodiments, and various changes, modifications, and improvements can be made based on the knowledge of those skilled in the art without departing from the spirit of the invention.

(1. Wiring Structure)

FIG. 1A is a schematic cross-sectional view showing a wiring structure 10 provided in a semiconductor device according to an embodiment of the invention. The wiring structure 10 includes an insulating layer 11, a conductive wiring 15, and a diffusion barrier layer 13 disposed between the insulating layer 11 and the conductive wiring 15 in a manner of being in contact with both the insulating layer 11 and the conductive wiring 15.

In an embodiment, the insulating layer contains a silicon oxide and/or a silicon oxide containing at least one element of C, N, and H. In a preferred embodiment, the insulating layer may contain a silicon oxide and/or a silicon oxide containing at least one element of C, N, and H in an amount of 90% by mass or more in total, 95% by mass or more, or even 99% by mass or more. Specific examples of the silicon oxide constituting the insulating layer include, but not limited to, silicon dioxide ($SiO_2$), silicon oxycarbide ($SiO_xC_y$), silicon oxycarbide hydride ($SiO_xC_yH_z$), and silicon oxynitride ($SiO_xN_y$).

In an embodiment, the conductive wiring contains Cu and/or Co. In a preferred embodiment, the conductive wiring may contain Cu and/or Co in an amount of 50% by mass or more in total, 90% by mass or more, or 99% by mass or more. In another embodiment, the conductive wiring may contain Cu in an amount of 90% by mass or more, or 99% by mass or more. Further, in yet another embodiment, the conductive wiring may contain Co in an amount of 90% by mass or more, or 99% by mass or more.

In an embodiment, the diffusion barrier layer is made of an alloy having an amorphous structure containing a first metal and a second element in an amount of 90% by mass or more in total. In another embodiment, the diffusion barrier layer is made of an alloy having an amorphous structure containing the first metal and the second element in an amount of 95% by mass or more in total. In yet another embodiment, the diffusion barrier layer is made of an alloy having an amorphous structure containing the first metal and the second element in an amount of 99% by mass or more in total. The diffusion barrier layer may not contain an element other than that of the first metal and the second element, and may contain an intentionally added element in addition to inevitable impurities. Examples of the intentionally added element include, but not limited to, a group 15 element such as nitrogen and phosphorus. The intentionally added element may be one element added alone, or two or more elements added in combination.

As the first metal, any one selected from Co, Ru, and Mo can be selected. These metals have low electrical resistivity and are also excellent in wettability and adhesion to Cu and/or Co, which is a constituent material of the conductive wiring. Accordingly, these metals are advantageous in exhibiting a liner function. However, Co, Ru, and Mo are likely to have a polycrystalline structure, and Cu and/or Co, which is a constituent material of the conductive wiring along a grain boundary, cannot be prevented from diffusing into the insulating layer. Further, there is also a problem that these metals do not have sufficient adhesion to the insulating layer.

On the other hand, the inventors of the invention have conceived an idea of appropriately combining the second element with the first metal such that the amorphous structure can be stably present. When an amorphous structure without a grain boundary can be stably present, the above-described diffusion can be effectively prevented, and a diffusion barrier function and the liner function can be simultaneously exhibited. Further, by selecting, as the second element, an element having a strong tendency to form an oxide, that is, an element having a large negative value of a standard Gibbs energy of oxide formation, adhesion to the insulating layer can be secured.

When the first metal is Co, the second element is preferably one or two or more selected from Zr, Al, and Nb. From a viewpoint that a Co—Zr alloy can stably form an amorphous structure, an atomic ratio of Co and Zr in the Co—Zr alloy preferably satisfies $0.1 \leq Zr/(Co+Zr) \leq 0.8$. In addition, from a viewpoint that the diffusion barrier function and the adhesion can be favorably secured, the atomic ratio more preferably satisfies $0.15 \leq Zr/(Co+Zr) \leq 0.5$.

From a viewpoint that a Co—Al alloy can stably form an amorphous structure, an atomic ratio of Co and Al in the Co—Al alloy preferably satisfies $0.4 \leq Al/(Co+Al) \leq 0.9$. In addition, from the viewpoint that the diffusion barrier function and the adhesion can be favorably secured, the atomic ratio more preferably satisfies $0.5 \leq Al/(Co+Al) \leq 0.8$.

From a viewpoint that a Co—Nb alloy can stably form an amorphous structure, an atomic ratio of Co and Nb in the Co—Nb alloy preferably satisfies $0.4 \leq Nb/(Co+Nb) \leq 0.9$. In addition, from the viewpoint that the diffusion barrier function and the adhesion can be favorably secured, the atomic ratio more preferably satisfies $0.5 \leq Nb/(Co+Nb) \leq 0.8$.

When the first metal is Ru, the second element is preferably Zr. From a viewpoint that a Ru—Zr alloy can stably form an amorphous structure, an atomic ratio of Ru and Zr in the Ru—Zr alloy preferably satisfies $0.1 \leq Zr/(Ru+Zr) \leq 0.8$. In addition, from the viewpoint that the diffusion barrier function and the adhesion can be favorably secured, the atomic ratio more preferably satisfies $0.3 \leq Zr/(Ru+Zr) \leq 0.6$.

When the first metal is Mo, the second element is preferably one or two selected from Y and B.

From a viewpoint that a Mo—Y alloy can stably form an amorphous structure, an atomic ratio of Mo and Y in the Mo—Y alloy preferably satisfies $0.5 \leq Y/(Mo+Y) \leq 0.9$. In addition, from the viewpoint that the diffusion barrier function and the adhesion can be favorably secured, the atomic ratio more preferably satisfies $0.6 \leq Y/(Mo+Y) \leq 0.8$.

From a viewpoint that a Mo—B alloy can stably form an amorphous structure, an atomic ratio of Mo and B in the Mo—B alloy preferably satisfies $0.2 \leq B/(Mo+B) \leq 0.8$. In addition, from the viewpoint that the diffusion barrier function and the adhesion can be favorably secured, the atomic ratio more preferably satisfies $0.3 \leq B/(Mo+B) \leq 0.7$.

From a viewpoint that a Mo—Y—B alloy can stably form an amorphous structure, an atomic ratio of Mo, Y, and B in the Mo—Y—B alloy preferably satisfies $0.5 \leq (Y+B)/(Mo+Y+B) \leq 0.9$. In addition, from the viewpoint that the diffusion barrier function and the adhesion can be favorably secured, the atomic ratio more preferably satisfies $0.6 \leq (Y+B)/(Mo+Y+B) \leq 0.8$.

In the alloy having the amorphous structure containing the first metal and the second element in an amount of 90% by mass or more in total, an atomic concentration of the first metal is preferably equal to or higher than an atomic concentration of the second element from a viewpoint of achieving both the diffusion barrier function and the liner function.

From a viewpoint of application to a miniaturized wiring structure of a semiconductor device, a thickness of the diffusion barrier layer can be 5 nm or less or 3 nm or less and can be, for example, 1 nm to 5 nm according to an embodiment.

In the present description, the thickness and a composition of the diffusion barrier layer are determined by a procedure as follows. For example, a case will be described in which an alloy thin film is formed by simultaneously sputtering simple substances of the elements with respect to the diffusion barrier layer made of the first metal and the second element. First, only the first metal is used for film formation by sputtering, and a film formation rate is determined by measuring a relationship between a film formation time and a film thickness. The film thickness can be measured using a stylus-type film thickness meter. Next, only the second element is used for film formation by sputtering to determine the film formation rate. Film formation conditions are adjusted based on these film formation rates so as to obtain the alloy thin film having a desired composition. Further, the composition of the obtained alloy thin film is measured using an X-ray fluorescent analyzer (XRF), and it is confirmed that a desired composition and the actual composition are obtained with an error of +0.1 atomic % or less.

Alternatively, as a qualitative measurement method, a cross section of a sample having a laminated structure of a conductive wiring, a diffusion barrier layer, an insulating layer, and a silicon substrate is observed by a scanning transmission electron microscope (STEM), an elemental analysis (STEM-EDS analysis) for constituent elements by an energy dispersive X-ray spectrometer (EDS) is executed in a thickness direction of the laminated structure, and a characteristic X-ray intensity profile showing energy specific to each constituent element is obtained. An atomic concentration profile of the constituent elements of the layers can be qualitatively known based on the obtained intensity profile. This information is useful for examining presence or absence of interdiffusion between the layers when a high-temperature heat treatment is performed.

Measurement conditions for executing the STEM-EDS analysis are set to be an acceleration voltage of 200 kV, observation magnification of 500,000 times, and a beam diameter of 0.2 nm. Since the intensity profile tends to be broad as the beam diameter increases, it is desirable to set the beam diameter to a constant value of 1 nm or less in terms of measurement with reproducibility.

The semiconductor device to which the invention can be applied is not particularly limited as long as at least a part of the semiconductor device has the wiring structure according to the above embodiment. Examples of the semiconductor device include a semiconductor integrated circuit including a multilayer wiring (typically, a wiring having 10 or more layers) such as an LSI. In particular, the invention can be preferably applied to a semiconductor device having a wiring structure. The wiring structure has a wiring width of 25 nm or less and preferably 15 nm or less at a level at which a degree of increase in wiring resistance in association with miniaturization cannot be ignored even when a volume ratio of the wiring is slightly reduced.

The wiring structure according to an embodiment of the invention can be applied to a wiring structure positioned at a lowest layer and formed in a middle of line (MOL) step subsequent to a front end of line (FEOL) step of forming a transistor on a semiconductor substrate in the semiconductor integrated circuit. The wiring structure according to another embodiment of the invention can be applied to a wiring structure, which has a metal layer formed in a back end of line (BEOL) step after the MOL step in the semiconductor integrated circuit.

(2. Method for Forming Wiring Structure)

An example of a process for forming a wiring structure according to an embodiment of the invention will be described with reference to FIG. 1B.

(1) First, a wiring trench 12 is formed in the insulating layer 11. In the embodiment, the insulating layer 11 may constitute an inter-wiring insulating film. In another embodiment, the insulating layer 11 may constitute an interlayer insulating film. The insulating layer 11 can be formed by, in addition to a chemical vapor deposition (CVD) method, a coating method such as a spin coating method or a spray method. The wiring trench 12 can be formed by known lithography and etching techniques. A contact hole and a via hole may further be provided in the wiring trench 12. In the present description, it is assumed that concepts of the contact hole and the via hole are included in the wiring trench.

(2) Next, the diffusion barrier layer 13 is formed on an inner surface of the wiring trench 12. The diffusion barrier layer 13 can be formed by, for example, a sputtering method, the CVD method, or an atomic layer deposition (ALD) method.

(3) Next, the conductive wiring 15 is embedded in the wiring trench 12 after the diffusion barrier layer 13 is formed. The embedding of the conductive wiring 15 includes, for example, a step of forming a seed layer on the barrier layer and a subsequent electrolytic plating step.

EXAMPLES

Hereinafter, examples of the invention will be described together with comparative examples, but these examples are provided for better understanding of the invention and advantages thereof, and are not intended to limit the invention.

(1. Evaluation of Crystal Structure and Composition of Co—Zr Alloy Film)

A p-type silicon wafer was placed into a magnetron sputtering device capable of simultaneously sputtering a Co target and a Zr target in the same chamber, and a Co—Zr alloy film having a thickness of 100 nm was formed on a $SiO_2$ film by a co-sputter method under vacuum conditions (vacuum degree: 0.6 Pa and Ar: 15 sccm). In the above test, various laminated bodies having different compositions of Co—Zr alloy films were obtained by changing input power of a sputter cathode to which the Co target and the Zr target were attached. The composition of the obtained Co—Zr alloy film having a planar shape was measured by irradiating a film surface with X-rays using the XRF.

Next, a cross-sectional material thinned by a focused ion beam (FIB) device was taken out from the obtained laminated body by microsampling, and a diffraction pattern was obtained from a portion of the alloy film of the laminated body by the STEM (manufactured by JEOL Ltd., model JEM-2100F). When the alloy film has a complete amorphous structure, the diffraction pattern shows a halo ring. On the other hand, when microcrystals are contained in the alloy film, spots appear in the diffraction pattern. Therefore, crystal structures of the alloy films having various compositions were evaluated by setting a case in which the alloy film presents a complete halo as A, setting a case in which partial diffraction spots are observed as B, and setting a case in which only spots are observed as C. Results are shown in Table 1. Further, a composition analysis along the thickness direction of the laminated body was executed using a STEM-EDS (manufactured by JEOL Ltd., model 6700F). As a result, it was confirmed that Co and Zr were present in the alloy film.

(2. Evaluation of Adhesion Between Co—Zr Diffusion Barrier Layer and Insulating Layer)

A silicon wafer with a $SiO_2$ film having a thickness of 20 nm was placed into the magnetron sputtering device capable of simultaneously sputtering the Co target and the Zr target in the same chamber, and a Co—Zr alloy film having a thickness of 150 nm was formed on the $SiO_2$ film by the co-sputter method under the vacuum conditions (vacuum degree: 0.6 Pa and Ar: 15 sccm). A laminated structure of the obtained laminated body is schematically shown in FIG. 3. In the above tests, various laminated bodies having different compositions of Co—Zr alloy films were obtained by changing the input power of the sputter cathode to which the Co target and the Zr target were attached.

Adhesion between the Co—Zr alloy film (Co—Zr diffusion barrier layer) and the $SiO_2$ film in the laminated body obtained in the above tests was evaluated according to ASTM D3359-97 (tape test). Specifically, 11×11 notches were formed in the Co—Zr alloy film according to each test example in a grid pattern at intervals of 1 mm, then a cellophane adhesive tape having an adhesive force of 4 N/cm was attached to the Co—Zr alloy film, and a state of a peeled location of the Co—Zr alloy film when the tape was peeled off was evaluated in scales of 0 to 5 according to ASTM D3359-97. Higher adhesion leads to a larger evaluation value. The tape test was performed at room temperature (25° C.), and was separately performed after heat treatment at 260° C. for 10 minutes and cooling to room temperature, and after heat treatment at 400° C. for 10 minutes and cooling to room temperature. From these results, the Co—Zr alloy films having various compositions were evaluated by setting a case in which an evaluation in ASTM D3359-97 was 5 in any of temperature conditions as A, setting a case in which the evaluation was 3 to 4 in any of the temperature conditions as B, and setting a case in which the evaluation was 2 or less in any of the temperature conditions as C. Results are shown in Table 1.

(3. Evaluation of Adhesion Between Cu Thin Film and Co—Zr Diffusion Barrier Layer)

The silicon wafer with the $SiO_2$ film having a thickness of 20 nm was placed into the magnetron sputtering device capable of simultaneously sputtering the Co target and the Zr target in the same chamber, and a Co—Zr alloy film having a thickness of 3 nm was formed on the $SiO_2$ film by the co-sputter method. A composition of a Co—Zr alloy film was changed by changing the input power of each sputter cathode. Further, a Cu thin film having a thickness of 150 nm was formed on the Co—Zr alloy film. Thicknesses of the $SiO_2$ film, the Co—Zr alloy film, and the Cu thin film were calculated based on a film formation rate determined in advance by measuring a relationship between a film formation time and a film thickness. In measuring the film formation rate, a stylus-type film thickness meter (manufactured by Bruker Corp., model DektakXT) was used.

Adhesion between the Cu thin film and the Co—Zr alloy film in the laminated body obtained in the above test was evaluated according to ASTM D3359-97 (tape test). The tape test was performed at room temperature (25° C.), and was separately performed after heat treatment at 260° C. for 10 minutes and cooling to room temperature, and after heat treatment at 400° C. for 10 minutes and cooling to room temperature. From these results, various compositions were evaluated by setting a case in which an evaluation in ASTM D3359-97 was 5 in any of temperature conditions as A, setting a case in which the evaluation was 3 to 4 in any of the temperature conditions as B, and setting a case in which the evaluation was 2 or less in any of the temperature conditions as C. Results are shown in Table 1.

(4. Evaluation of Diffusion Barrier Property of Co—Zr Alloy Film)

Samples used for an evaluation were prepared as follows. A $SiO_2$ layer having a thickness of 20 nm was formed on a p-type silicon wafer, a resist film was formed on the $SiO_2$ layer, and an electrode-shaped hole was formed in the resist film by photolithography. A Co—Zr alloy film having a thickness of 3 nm and a Cu film having a thickness of 150 nm were formed on the resist film. Thereafter, the resist film was peeled off with acetone. At this time, Cu and Co—Zr formed in the hole portion of the resist film remain on the wafer and function as an electrode. An aluminum electrode having a thickness of 400 nm was prepared on a back surface of the wafer by sputtering. The obtained laminated body was pre-annealed in an atmosphere of Ar+5 volume % $H_2$ at 300° C. for 30 minutes, and then a capacitance-voltage (CV) measurement is performed to measure a flat band voltage ($V_{FB}$). The VEB was set as a value in an initial state. Thereafter, while the laminated body was heated to 250° C. in the atmosphere of Ar+5 volume % $H_2$, a bias temperature stress (BTS) was given in which an electric field of 3.0 MV/cm was applied between two electrodes for 45 minutes using Cu as a positive electrode and Al as a negative electrode. Thereafter, the CV measurement was performed to measure a $V_{FB}$. A difference between the $V_{FB}$ (BTS) after the BTS test and the $V_{FB}$ (initial) in the initial state was obtained, and when $V_{FB}$ (BTS)-$V_{FB}$ (initial)≥−0.3 V was satisfied, a Co—Zr alloy film was evaluated as having a diffusion barrier function. When the criterion was satisfied, it was denoted by Y, and when the criterion was not satisfied, it was denoted by N. Results are shown in Table 1.

A Co—Al alloy, a Co—Nb alloy, a Ru—Zr alloy, a Mo—Y alloy, and a Mo—B alloy were used, instead of the Co—Zr alloy, as a diffusion barrier layer, and a structure evaluation, an adhesion evaluation, and a barrier property evaluation were performed on the diffusion barrier layer in the same manner as described above. Results are shown in Tables 2 to 6.

TABLE 1

Diffusion barrier layer: Co—Zr alloy

| Atomic ratio of Zr/(Co + Zr) | 0.05 | 0.1 | 0.15 | 0.2 | 0.4 | 0.5 | 0.8 | 0.8 | 0.85 | 0.9 |
|---|---|---|---|---|---|---|---|---|---|---|
| Crystal structure | C | B | A | A | A | A | A | B | C | C |
| Adhesion (Co – Zr/SiO$_2$) | C | B | A | A | A | A | A | A | A | A |
| Adhesion (Cu/Co – Zr) | A | A | A | A | A | B | B | B | B | C |
| Barrier function | N | Y | Y | Y | Y | Y | Y | Y | N | N |
| Comprehensive evaluation | C | B | A | A | A | A | B | B | C | C |

TABLE 2

Diffusion barrier layer: Co—Al alloy

| Atomic ratio of Al/(Co + Al) | 0.1 | 0.2 | 0.4 | 0.5 | 0.6 | 0.7 | 0.8 | 0.9 | 0.95 |
|---|---|---|---|---|---|---|---|---|---|
| Crystal structure | C | C | B | A | A | A | A | B | C |
| Adhesion (Co – Al/SiO$_2$) | B | B | B | A | A | A | A | A | A |
| Adhesion (Cu/Co – Al) | A | A | A | A | A | A | B | B | C |
| Barrier function | N | N | Y | Y | Y | Y | Y | Y | N |
| Comprehensive evaluation | C | C | B | A | A | A | A | B | C |

TABLE 3

Diffusion barrier layer: Co—Nb alloy

| Atomic ratio of Nb/(Co + Nb) | 0.1 | 0.2 | 0.4 | 0.5 | 0.6 | 0.7 | 0.8 | 0.9 | 0.95 |
|---|---|---|---|---|---|---|---|---|---|
| Crystal structure | C | C | B | A | A | A | A | B | C |
| Adhesion (Co – Nb/SiO$_2$) | C | C | B | A | A | A | A | A | A |
| Adhesion (Cu/Co – Nb) | B | B | A | A | A | A | A | B | C |
| Barrier function | N | N | Y | Y | Y | Y | Y | Y | N |
| Comprehensive evaluation | C | C | B | A | A | A | A | B | C |

TABLE 4

Diffusion barrier layer: Ru—Zr alloy

| Atomic ratio of Zr/(Ru + Zr) | 0.05 | 0.1 | 0.2 | 0.3 | 0.4 | 0.5 | 0.8 | 0.8 | 0.85 | 0.95 |
|---|---|---|---|---|---|---|---|---|---|---|
| Crystal structure | C | B | B | A | A | A | A | A | C | C |
| Adhesion (Ru – Zr/SiO$_2$) | C | B | B | A | A | A | A | A | A | A |
| Adhesion (Ou/Ru – Zr) | A | A | A | A | A | A | A | B | B | C |
| Barrier function | N | Y | Y | Y | Y | Y | Y | Y | N | N |
| Comprehensive evaluation | C | B | B | A | A | A | A | B | C | C |

TABLE 5

Diffusion barrier layer: Mo—Y alloy

| Atomic ratio of Y/(Mo + Y) | 0.1 | 0.2 | 0.4 | 0.5 | 0.6 | 0.7 | 0.8 | 0.9 | 0.95 |
|---|---|---|---|---|---|---|---|---|---|
| Crystal structure | C | C | C | A | A | A | A | B | C |
| Adhesion(Mo – Y/SiO$_2$) | C | B | B | B | A | A | A | A | A |
| Adhesion(Cu/Mo – Y) | A | A | A | A | A | A | A | B | C |
| Barrier function | N | N | N | Y | Y | Y | Y | Y | N |
| Comprehensive evaluation | C | C | C | B | A | A | A | B | C |

TABLE 6

Diffusion barrier layer: Mo—B alloy

| Atomic ratio of B/(Mo + B) | 0.1 | 0.2 | 0.3 | 0.4 | 0.5 | 0.6 | 0.7 | 0.8 | 0.9 |
|---|---|---|---|---|---|---|---|---|---|
| Crystal structure | C | B | A | A | A | A | A | B | C |
| Adhesion (Mo – B/SiO$_2$) | C | B | A | A | A | A | A | A | A |
| Adhesion (Cu/Mo – B) | B | A | A | A | A | A | A | B | C |
| Barrier function | Y | Y | Y | Y | Y | Y | Y | Y | N |
| Comprehensive evaluation | C | B | A | A | A | A | A | B | C |

From the results shown in Tables 1 to 6, a comprehensive evaluation was made in three scales of A (excellent), B (good), and C (unacceptable) as follows. First, a case in which an evaluation of B or more was obtained in the evaluation of the crystal structure was evaluated as B or more in the comprehensive evaluation, and a case in which an evaluation of C was obtained was evaluated as C in the comprehensive evaluation. Next, a case, in which the criterion of the barrier function was satisfied and the crystal structure and the adhesion were both evaluated as A, was evaluated as A. Results of the comprehensive evaluation are also shown in Tables 1 to 6.

Based on the results of the above comprehensive evaluation, the following points were confirmed.

In the Co—Zr alloy, 0.1≤Zr/(Co+Zr)≤0.8 is preferably satisfied, and 0.15≤Zr/(Co+Zr)≤0.5 is more preferably satisfied.

In the Co—Al alloy, 0.4≤Al/(Co+Al)≤0.9 is preferably satisfied, and 0.5≤Al/(Co+Al)≤0.8 is more preferably satisfied.

In the Co—Nb alloy, 0.4≤Nb/(Co+Nb)≤0.9 is preferably satisfied, and 0.5≤Nb/(Co+Nb)≤0.8 is more preferably satisfied.

In the Ru—Zr alloy, 0.1≤Zr/(Ru+Zr)≤0.8 is preferably satisfied, and 0.3≤Zr/(Ru+Zr)≤0.6 is more preferably satisfied.

In the Mo—Y alloy, 0.5≤Y/(Mo+Y)≤0.9 is preferably satisfied, and 0.6≤Y/(Mo+Y)≤0.8 is more preferably satisfied.

In the Mo—B alloy, 0.2≤B/(Mo+B)≤0.8 is preferably satisfied, and 0.3≤B/(Mo+B)≤0.7 is more preferably satisfied.

In the Mo—Y—B alloy, 0.5≤(Y+B)/(Mo+Y+B)≤0.9 is preferably satisfied, and 0.6≤(Y+B)/(Mo+Y+B)≤0.8 is more preferably satisfied.

REFERENCE SIGNS LIST

10: wiring structure
11: insulating layer
12: wiring trench
13: diffusion barrier layer
15: conductive wiring
20: wiring structure
21: insulating layer
22: wiring trench
23: diffusion barrier layer
24: liner layer
25: copper wiring
30: laminated body
31: p-type silicon wafer
32: SiO$_2$ film
33: Co—Zr alloy film

The invention claimed is:

1. A semiconductor device, which has a wiring structure including an insulating layer, a conductive wiring, and a diffusion barrier layer disposed between the insulating layer and the conductive wiring in a manner of being in contact with both the insulating layer and the conductive wiring, wherein the insulating layer contains a silicon oxide and/or a silicon oxide containing at least one element of C, N, and H, the conductive wiring contains Cu and/or Co, the diffusion barrier layer is made of an alloy having an amorphous structure containing a first metal and a second element in an amount of 90% by mass or more in total, the first metal is any one selected from Co, Ru, and Mo, wherein when the first metal is Co, the second element is one or two or more selected from Al, and Nb, wherein when the first metal is Ru, the second element is Zr, and wherein when the first metal is Mo, the second element is one or two selected from Y and B.

2. The semiconductor device according to claim 1, wherein the diffusion barrier layer has a thickness of 5 nm or less.

3. The semiconductor device according to claim 1, wherein the first metal is Co, and the second element is one or two or more selected from Al, and Nb.

4. The semiconductor device according to claim 1, wherein the first metal is Ru and the second element is Zr.

5. The semiconductor device according to claim 1, wherein the first metal is Mo, and the second element is one or two selected from Y and B.

6. The semiconductor device according to claim 2, wherein the first metal is Co, and the second element is one or two or more selected from Al, and Nb.

7. The semiconductor device according to claim 2, wherein the first metal is Ru and the second element is Zr.

8. The semiconductor device according to claim 2, wherein the first metal is Mo, and the second element is one or two selected from Y and B.

* * * * *